United States Patent
Blackshear et al.

(10) Patent No.: US 6,774,475 B2
(45) Date of Patent: Aug. 10, 2004

(54) VERTICALLY STACKED MEMORY CHIPS IN FBGA PACKAGES

(75) Inventors: Edmund D. Blackshear, Wappingers Falls, NY (US); William F. Beausoleil, Hopewell Junction, NY (US); N. James Tomassetti, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/056,256

(22) Filed: Jan. 24, 2002

(65) Prior Publication Data

US 2003/0137041 A1 Jul. 24, 2003

(51) Int. Cl.[7] .............................................. H01L 23/02
(52) U.S. Cl. ........................ 257/686; 257/685; 257/778; 257/779; 257/780; 257/723; 257/724; 257/738
(58) Field of Search ................................. 257/685–686, 257/723–724, 778–780, 738, 790, 735; 361/790, 735

(56) References Cited

U.S. PATENT DOCUMENTS

| | | | |
|---|---|---|---|
| 5,655,290 A | * | 8/1997 | Moresco et al. ............... 29/830 |
| 5,694,366 A | * | 12/1997 | Chevallier et al. .......... 365/207 |
| 5,783,870 A | | 7/1998 | Mostafazadeh et al. |
| 5,854,507 A | * | 12/1998 | Miremadi et al. .......... 257/686 |
| 5,907,903 A | | 6/1999 | Ameen et al. |
| 6,051,878 A | | 4/2000 | Akram et al. |
| 6,072,233 A | | 6/2000 | Corisis et al. |
| 6,268,649 B1 | | 7/2001 | Corisis et al. |
| 2002/0086459 A1 | * | 7/2002 | Nakajima ................... 438/106 |

* cited by examiner

Primary Examiner—Luan Thai
(74) Attorney, Agent, or Firm—McGinn & Gibb, PLLC; Jay H. Anderson, Esq.

(57) ABSTRACT

A method and structure for a memory structure that includes a plurality of substrates stacked one on another is disclosed. The invention includes a plurality of connectors connecting the substrates to one another and a plurality of memory chip packages mounted on the substrates. The connectors have a size sufficient to form a gap between the substrates. The gap is larger than a height of the memory chip packages.

17 Claims, 1 Drawing Sheet

VERTICALLY STACKED MEMORY CHIPS IN FBGA PACKAGES

BACKGROUND OF THE INVENTION

1. Field of the Invention

The present invention generally relates to memory structures and more particularly to an improved vertically stacked memory structure.

2. Description of the Related Art

With each new generation of electronic and computing devices, the size of the devices decreases while their operating speed increases. An important feature within such devices is the ability to store information using, for example, dynamic random access memory (DRAM) arrays.

The size of the memory arrays can be reduced by reducing the size of the individual memory devices and/or packing the memory devices closer together. In addition, the arrays can be stacked vertically so that additional memory arrays can be utilized without increasing the overall "footprint." Data in memory devices is addressed by calling out a particular coordinate in a rectangular array. Memory configurations may be described in such terms as 256K by 4. In this case, there are 4 memory arrays consisting of approximately 256,000 distinct data locations each. In memory addressing, in this case, there will be one set of address pins per module, sufficient to identify a single element of a binary array of 256,000 elements. When reading and writing data, 4 bits of data from identical locations in each array are read or written using the same address setup. Address pins are shared by 4 array elements, limiting needed address pins and their interconnects to ¼ the number needed if each array were addressed separately. In single module stacked memories, addresses are commoned between modules in the stack, but each stack requires a full complement of address interconnects. One such stacked memory array is shown in U.S. Pat. No. 6,268,649, to Corisis et al. (hereinafter "Corisis"), the disclosure of which is incorporated herein by reference for the purpose of indicating the background of the present invention.

In the Corisis patent, a stackable fine ball grid array (FBGA) package is disclosed that allows the stacking of one array upon another. This stackable FBGA package is configured such that conductive elements are placed along the outside perimeter of a semiconductor device (integrated circuit (IC) device) mounted to the FBGA. The conductive elements also are of sufficient size so that they extend beyond the bottom or top surface of the IC device. Wire interconnects connect the IC device in a way that does not increase the overall profile of the package. Encapsulating material protects both the IC device and the wire interconnect as the conductive elements make contact with the FBGA, positioned below or above, to form a stack. The IC device, such as a memory chip, is mounted upon a first surface of a printed circuit board substrate forming part of the FBGA.

Certain pins on the FBGA in the stack may require an isolated connection to the PC board. This allows IC devices to be stacked one upon the other while maintaining a unique pin out for each pin required in the stack. The number of chips commonly addressed in the stack is expanded to an optimum extent such that the number of memory address interconnects in the stacked module assembly is minimized. In this optimum structure, the number of data bits addressed in parallel is equal to the system word width. With such a structure, for each chip added to a deck in the stack structure, an address complement of interconnects needed to expand in the height direction is eliminated.

In some conventional structures, there is a single memory chip per vertical deck of the stack. This permits the assembly to expand in the height dimension only. If two or more chips are included per vertical deck of the stack, a yield detractor arises. Memory chips must be "burned in" to reduce infant mortality in order to produce acceptable field reliability performance. Conventional socket technology requires that chips be packaged in a first level package, such as an individual deck, for practical burn in. Expanding such conventional methods of using more than one chip per stack deck requires that the burn in be done at the deck level, resulting in the discard of one or more good memory chips for each infant mortality failure of a chip in that deck's burn in. Increasing the number of chips per deck increases the risk that a defective chip will be included in the deck. With the wire bonded structure used to bond chips to decks, it is difficult or impossible to remove a single defective chip. Therefore, if a defective chip is included on a deck, the entire deck must be discarded, often resulting in the discard of a large number of non-defective chips. If the structure is expanded to include multiple devices per deck, it becomes expensive and time-consuming to manufacture (especially when the "burn-in" and testing procedures are completed) and has a low yield (high defect) rate. For this reason, conventional structures must use significantly more than the optimum (minimum) number of solder interconnects to address a given memory structure.

SUMMARY OF THE INVENTION

In view of the foregoing and other problems, disadvantages, and drawbacks of the conventional stacked memory structures, the present invention has been devised, and it is an object of the present invention, to provide a structure and method for an improved stacked memory structure that has a low defect rate.

In order to attain the object suggested above, there is provided, according to one aspect of the invention, a memory structure including a plurality of substrates stacked one on another. The invention includes connectors that connect the substrates to one another and memory chip packages mounted on each of the substrates. The connectors have a size sufficient to form a gap between the substrates. The gap is larger than a height of the memory chip packages.

Each of the memory chip packages has a pre-tested memory chip package that is tested for defects before being mounted on the substrates. The memory chip packages and the substrates include identical electrical connections. Each of the substrates has a plurality of the memory chip packages mounted thereon. The connectors include solder balls. The invention also has a thermal connection between a top of the memory chip packages and a bottom of an adjacent substrate such that the thermal connection fills the gap. The memory chip packages each include an array of memory elements mounted within a package.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
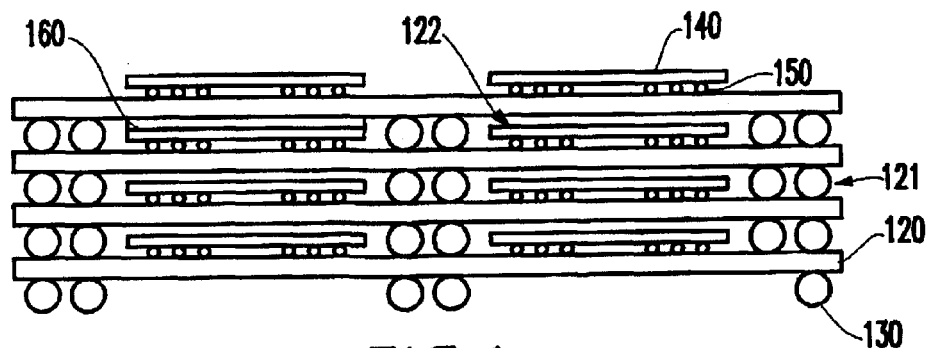
FIG. 1 is a schematic side-view diagram of a stacked memory chip structure according to the invention.

A structure embodying the invention is shown in FIG. 1. More specifically, the structure includes a number of substrates 120 which are preferably printed circuit boards. Two or more chip scale packages (CSPs) 140 are mounted on each substrate 120.

Figure 2:
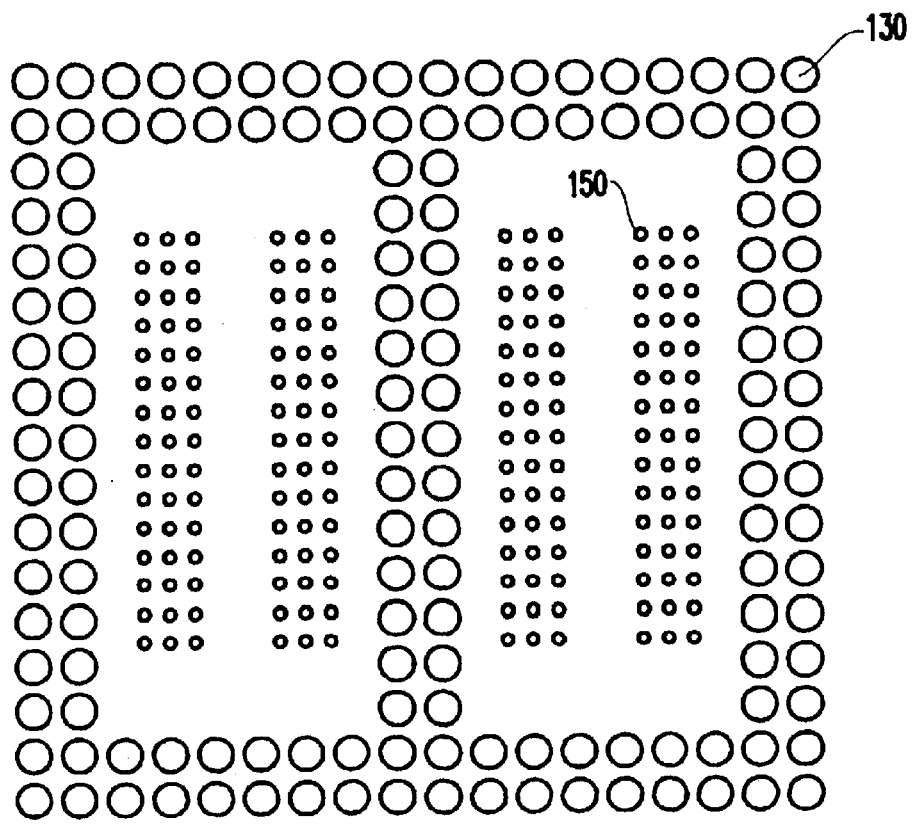
FIG. 2 is a schematic diagram of a top-view of the solder ball connections used with the invention.

FIG. 2 shows a top-view of the solder connections present on each of the substrates 120. More specifically, the connections comprise a fine ball grid array (FBGA) of solder balls 130, 150. These solder balls 130, 150 form an electrical and mechanical attachment between the different substrates (larger balls 130), and between the chip packages and the substrates (smaller balls 150). The larger solder ball array pattern 130 straddles the FBGA 150, as shown in FIG. 2. All of the data pins of each chip package 140 are brought singly to the circuit board connections 150. The solder balls 130 have a large enough diameter to separate the substrates 120 a sufficient distance to create a gap 121 between the substrates. This gap 121 is large enough to allow the chip packages 140 to fit between the substrates 120. In a preferred embodiment, there remains a gap 122 between the top of each chip package 140 and the bottom of the substrate 120. In another embodiment, a thermal material 160 can be positioned to fill the gap 122 to allow thermal dissipation between the top of the chip package 140 and the bottom of the adjacent substrate 120. The thermally conductive material 160 can be selectively applied to some or all of the chip packages 140 within a given stack structure.

A noteworthy feature of this embodiment is the use of chip scale packages 140. A silicon chip is generally a rectangular segment of a silicon wafer, consisting of a highly complex active surface, with the bulk of the material being single crystal silicon. Elements of the active surface, important to chip packaging, are primarily the bond pads for electrical connection of the active surface of the chip to the chip package and through the package to the balance of an electronic system.

Figure 3:
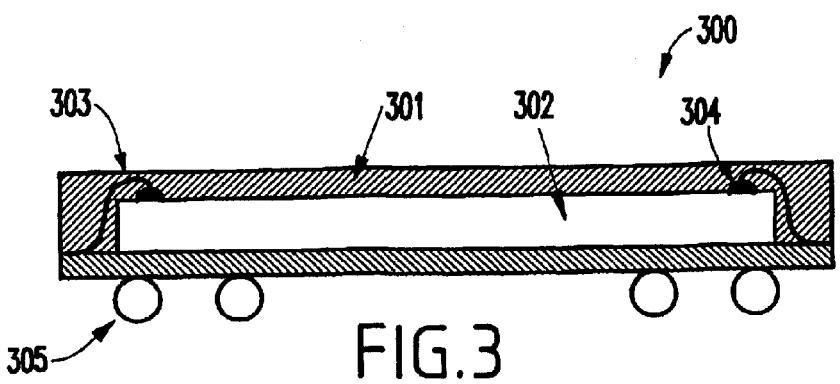
FIG. 3 is a schematic diagram of a chip package.

A chip package 300, as shown in FIG. 3, serves several purposes. The chip package 300 includes a substrate 302 and bond wires 303 that electrically connect pads 304 on the chip 301 to the solder balls 305. The chip package 300 provides more robust electrical connection features (that is, solder balls 305) than chip bond pads 303 for the purpose of testing chips. The chip package 300 transforms the chip 301 into a configuration that can be readily and reliably bonded to the next level of assembly, typically a printed circuit board. The chip package 300 offers physical protection to the chip 301, both against mechanical damage and chemical attack. A chip package may include one or many chips, but is distinguished from higher-level assemblies in that it directly contacts the chip 301 silicon.

The practice of electrically exercising a silicon integrated circuit at high temperature and voltage conditions to cause failure of those circuits that would otherwise cause early failure in an electronic system is called "burn in." It is standard practice in the electronics industry to perform burn in on electronic circuit chips that have been assembled into single chip packages. The direct burn in of single chips (without chip packages) is impractical for several reasons. The chip's silicon, being a material more brittle than glass, is too fragile to withstand the forces involved in socketing, the process by which the chip or package is electrically temporarily contacted for testing, without damage. The chip bond pads 304, features designed for interconnection typically by wire bonding, are too small to be reliably and repeatably contacted by a reasonably-priced socket system. Chip bond pads directly exposed to the atmosphere in the high temperature environment necessary to weed out latent defects will oxidize such that the usability of post test wire bonding for package assembly will be reduced.

Burn in of multiple chip packages (e.g., packages having more than one chip) also presents difficulties. Wire bondable and over-molded type packages are not reworkable to remove and replace single defective chips. Thus, any failure of a single chip on a multichip package will result either in rework expense or the discard of the balance of still functional chips on the module. In addition, the functional wiring of a multichip module may make direct testing of a specific function of an individual chip difficult or impossible. Thus, burn in of a multichip module may be ineffective. Yield loss from burn in of a multichip module is compounded such that if the yield from a single chip is 0.9, 2 chips 0.81, 3 chips 0.73, etc., then in a 3 chip module, 27% would be discarded post burn in, even though statistically 2 chips in each device or approximately 66% of module value would, in fact, be good.

A structure made in accordance with the invention uses chip scale packages 140 that have been "burned-in" and tested, so that the structure is made of packages that are known to be "good" (non-defective). This substantially reduces the defect rate for multichip stack decks.

Because the invention utilizes chips that are known to be free of defects, many more chips can be utilized per deck (e.g., per substrate level) and the number of decks within the stack can be dramatically increased. Indeed, the only limit with the invention relates to the number of solder ball connections within the FBGA.

In addition, the invention uses identical connections at each deck level. Wiring in each layer of the stack moves all data lines incrementally. As a result, all data pins are brought to the circuit board using identical wiring for each layer in the stack (e.g., common addressing system in each deck stack).

The invention promotes using industry-standard components and common assembly tooling and practices. Further, with the invention, each layer of circuit board in the stack is identical so that separate part numbers need not be created and managed, and any number of layers of stack (up to the maximum allowable ballcount) may be used.

Benefits of this invention include providing a maximum density memory module constructed using industry-standard components and manufacturing practices. The inventive stacked memory module uses chip scale packaging technology which minimizes the number of solder interconnects between each single chip device and the module circuit board by allowing common addresses in each stack deck. The invention achieves efficiency of manufacture by using chip scale packages rather than chips as building blocks at each deck, amenable to standard burn in practices.

While the invention has been described in terms of preferred embodiments, those skilled in the art will recognize that the invention can be practiced with modification within the spirit and scope of the appended claims.

What is claimed is:

1. A memory structure comprising:
   a plurality of adjacent substrates stacked one on another;
   a plurality of connectors connecting said substrates to one another
   a memory chip package mounted on each of said substrates;

a first gap between a top or said memory chip package end a bottom of an adjacent substrate;

wherein said connectors have a size sufficient to form a second gap between said substrates;

wherein said second gap is larger than a height of said memory chip package; and wherein said connectors comprises solder balls arranged in a fine ball grid array.

2. The memory structure in claim 1, wherein said memory chip package comprises a pre-tested memory chip package that is tested for defects before being mounted on said substrates.

3. The memory structure in claim 1, wherein said memory chip package and said substrates includes identical electrical connections.

4. The memory structure in claim 1, wherein each of said substrates has a plurality of said memory chip package mounted thereon.

5. The memory structure in claim 1, further comprising a thermal material between a top of said memory chip package and a bottom of an adjacent substrate.

6. The memory structure in claim 1, wherein said memory chip package comprises a chip having an array of memory elements mounted within a package.

7. A memory structure comprising:

a plurality of adjacent substrates stacked one on another;

a plurality of connectors connecting said substrates to one another;

a memory chip package mounted on each of said substrates;

a first gap between a top of said memory chip package and a bottom of an adjacent substrate;

wherein said connectors have a size sufficient to form a second gap between said substrates;

wherein said second gap is larger than a height of said memory chip package;

wherein each memory chip package includes only a single memory chip; and wherein said connectors comprises solder balls arranged in a fine ball grid array.

8. The memory structure in claim 7, wherein said memory chip package comprises a pre-tested memory chip package that is tested for defects before being mounted on said substrates.

9. The memory structure in claim 7, wherein said memory chip package and said substrates include identical electrical connections.

10. The memory structure in claim 7, wherein each of said substrates has a plurality of said memory chip packages mounted thereon.

11. The memory structure in claim 7, further comprising a thermal material between a top of said memory chip package and a bottom of an adjacent substrate.

12. The memory structure in claim 7, wherein said memory chip package comprises a chip having an array of memory elements mounted within a package.

13. A vertically stacked memory module comprising:

a plurality of adjacent substrates stacked one on another;

a plurality of substrate spacers electrically connecting said substrates with one another;

a single memory chip package mounted on each of said substrates;

a plurality of package spacers connecting said memory chip package with said substrates;

a first gap between a top of said memory chip package and a bottom of an adjacent substrate;

wherein said memory chip package comprises a memory chip having an array of memory elements mounted within said package;

wherein said substrate spacers form a second gap between a top of said memory chip package and a bottom of said adjacent substrates;

wherein said second gap is greater than a height of said memory chip package; and wherein said substrate spacers and said package spacers comprise solder balls arranged in a fine ball arid array.

14. The memory module in claim 13, wherein said memory chip package comprises a pre-tested memory chip package that is tested for defects before being mounted on said substrates.

15. The memory module in claim 13, wherein said memory chip package and said substrates include identical electrical connections.

16. The memory module in claim 13, wherein each of said substrates has a plurality of said memory chip packages mounted thereon.

17. The memory module in claim 13, further comprising thermal material between a top of said memory chip package and a bottom of an adjacent substrate.

* * * * *